(12) United States Patent
Frank et al.

(10) Patent No.: US 10,615,250 B2
(45) Date of Patent: Apr. 7, 2020

(54) TAPERED METAL NITRIDE STRUCTURE

(71) Applicant: International Business Machines Corporation, Armonk, NY (US)

(72) Inventors: Martin M. Frank, Dobbs Ferry, NY (US); Hiroyuki Miyazoe, White Plains, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/175,029

(22) Filed: Oct. 30, 2018

(65) Prior Publication Data

US 2019/0067413 A1 Feb. 28, 2019

Related U.S. Application Data

(62) Division of application No. 15/213,065, filed on Jul. 18, 2016, now Pat. No. 10,147,782.

(51) Int. Cl.
*H01L 21/00* (2006.01)
*H01L 49/02* (2006.01)
(Continued)

(52) U.S. Cl.
CPC ........ *H01L 28/60* (2013.01); *H01L 29/40111* (2019.08); *H01L 29/516* (2013.01); *H01L 29/6684* (2013.01); *H01L 29/78391* (2014.09)

(58) Field of Classification Search
CPC ......... H01L 21/28291; H01L 21/76832; H01L 21/02244; H01L 21/31144;
(Continued)

(56) References Cited

U.S. PATENT DOCUMENTS

| | | |
|---|---|---|
| 5,242,543 A | 9/1993 | Maejima et al. |
| 5,670,062 A | 9/1997 | Lin et al. |

(Continued)

FOREIGN PATENT DOCUMENTS

| | | |
|---|---|---|
| JP | 5259108 A | 10/1993 |
| KR | 100420406 B1 | 2/2004 |

(Continued)

OTHER PUBLICATIONS

McDaniel, M. D., et al., "Incorporation of La in epitaxial SrTiO3 thin films grown by atomic layer deposition on SrTiO3-buffered Si (001) substrates", Journal of Applied Physics, Published online Jun. 13, 2014, 115, pp. 224108-1 to 224108-8.

(Continued)

*Primary Examiner* — Nikolay K Yushin
(74) *Attorney, Agent, or Firm* — Scully, Scott, Murphy & Presser, P.C.; L. Jeffrey Kelly, Esq.

(57) ABSTRACT

A tapered metal nitride structure having a gentle sloping (i.e., tapered) sidewall is provided that includes an oxygen rich metal nitride portion located between each metal nitride portion of a stack of metal nitride portions. The structure is formed by incorporating/introducing oxygen into an upper portion of a first metal nitride layer to form an oxygen rich metal nitride surface layer. A second nitride is then formed atop the oxygen rich metal nitride surface layer. The steps of oxygen incorporation/addition and nitride layer formation may be repeated any number of times. An etch mask is then provided and thereafter a sputter etch is performed to provide the tapered metal nitride structure. The tapered metal nitride structure may be used as an electrode in a semiconductor device.

20 Claims, 3 Drawing Sheets

(51) Int. Cl.
*H01L 29/78* (2006.01)
*H01L 29/66* (2006.01)
*H01L 29/51* (2006.01)
*H01L 21/28* (2006.01)
*H01L 29/00* (2006.01)

(58) Field of Classification Search
CPC ......... H01L 21/31105; H01L 29/78391; H01L 29/516; H01L 29/6684; H01L 29/518; H01L 29/0657; H01L 29/66; H01L 28/60; H01L 28/75; H01L 28/90
See application file for complete search history.

(56) References Cited

U.S. PATENT DOCUMENTS

| | | | |
|---|---|---|---|
| 6,191,033 B1 | 2/2001 | Liao et al. | |
| 6,218,256 B1 | 4/2001 | Agarwal | |
| 6,346,746 B1* | 2/2002 | Agarwal | H01L 28/60 257/532 |
| 7,485,579 B2* | 2/2009 | Sasagawa | H01L 21/02071 216/37 |
| 7,541,282 B2 | 6/2009 | Han et al. | |
| 7,648,909 B2 | 1/2010 | Lee et al. | |
| 8,030,205 B2 | 10/2011 | Lee et al. | |
| 8,871,107 B2 | 10/2014 | Fuller et al. | |
| 8,971,022 B2 | 3/2015 | Ishimoto et al. | |
| 9,666,663 B2 | 5/2017 | Laven et al. | |
| 2002/0197875 A1 | 12/2002 | Lin et al. | |
| 2005/0181610 A1* | 8/2005 | Sasagawa | H01L 21/02071 438/689 |
| 2014/0273437 A1 | 9/2014 | Fuller et al. | |
| 2015/0041962 A1 | 2/2015 | Laven et al. | |
| 2017/0170394 A1 | 6/2017 | Chen et al. | |
| 2017/0243969 A1 | 8/2017 | Laven et al. | |

FOREIGN PATENT DOCUMENTS

| | | |
|---|---|---|
| TW | 200939476 A | 9/2009 |
| WO | WO2007020874 A1 | 2/2009 |

OTHER PUBLICATIONS

Frank, D. J., "The Quantum Metal Ferroelectric Field-Effect Transistor", IEEE Transactions on Electron Devices, Jun. 2014, pp. 2145-2153, vol. 61, No. 6.

Yimit, A., et al., "Thin film composite optical waveguides for sensor applications: a review", Science Direct, Talanta, Mar. 2005, pp. 1102-1109, 65.

List of IBM Patents or Patent Applications Treated as Related dated Oct. 30, 2018, 2 Pages.

* cited by examiner

TAPERED METAL NITRIDE STRUCTURE

BACKGROUND

The present application relates to a semiconductor structure and a method of forming the same. More particularly, the present application relates to a semiconductor structure including a tapered metal nitride structure which, in some embodiments, may be employed as an electrode. The present application also relates to a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

In some applications, there is a need for providing thin conductive layers with a tapered structure as an electrode of a thin film semiconductor device. Preparing extremely gentle sloping conductive structures is difficult with existing methods. As such, there is a need for providing tapered conductive structures that can be used as electrode of a thin film semiconductor device.

SUMMARY

A tapered metal nitride structure having a gentle sloping (i.e., tapered) sidewall is provided that includes an oxygen rich metal nitride portion located between each metal nitride portion of a stack of metal nitride portions. The structure is formed by incorporating/introducing oxygen into an upper portion of a first metal nitride layer to form an oxygen rich metal nitride surface layer. A second nitride is then formed atop the oxygen rich metal nitride surface layer. The steps of oxygen incorporation/addition and nitride layer formation may be repeated any number of times. An etch mask is then provided and thereafter a sputter etch is performed to provide the tapered metal nitride structure. The tapered metal nitride structure may be used as an electrode in a semiconductor device.

In one aspect of the present application, a semiconductor structure is provided. In one embodiment of the present application, the semiconductor structure may include a metal nitride structure having at least one tapered sidewall and located on a surface of substrate. The metal nitride structure includes an oxygen rich metal nitride portion located between a first metal nitride portion and a second metal nitride portion. In some embodiments, additional nitride portions may be present and each nitride portion is separated from each other by an oxygen rich metal nitride portion.

In another aspect of the present application, a method of forming a semiconductor structure is provided. In one embodiment of the present application, the method may include providing a first metal nitride layer on a surface of a substrate, wherein an oxygen rich metal nitride surface layer is located in an upper portion of the first metal nitride layer. A second metal nitride layer is then formed on the oxygen rich metal nitride surface layer of the first metal nitride layer. A patterned mask is thereafter formed on the second metal nitride layer. A portion of each of the second metal nitride layer, the oxygen rich metal nitride surface layer, and the first metal nitride layer is then removed by sputter etching utilizing the patterned mask as an etch mask to provide a metal nitride structure having at least one tapered sidewall. Next, the patterned mask is removed.

DETAILED DESCRIPTION

Figure 1:
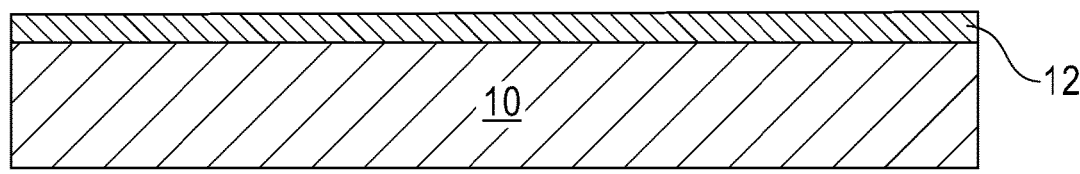
FIG. 1 is a cross sectional view of an exemplary semiconductor structure including a first metal nitride layer located on a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first FIG. 1, there is illustrated an exemplary semiconductor structure including a first metal nitride layer 12 located on a surface of a substrate 10. Substrate 10 of the present application may include a semiconductor material, a dielectric material, or any combination thereof including, for example, a dielectric material embedded within a semiconductor substrate, or a dielectric material formed on a surface of a semiconductor substrate.

The semiconductor material that may be used as the substrate 10 includes any material having semiconducting properties. The semiconductor material that can provide the 10 may include, but is not limited to, silicon (Si), germanium (Ge), silicon germanium alloys (SiGe), silicon carbide (SiC), III-V compound semiconductors, II-VI compound semiconductors or multilayered combinations thereof.

In some embodiments, substrate 10 may be a bulk semiconductor substrate. The term "bulk" denotes the entirety of the substrate is composed of at least one semiconductor material with no insulators and/or conductive materials present therein.

In yet other embodiments of the present application, substrate 10 may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

In embodiments in which substrate 10 is a dielectric material, the dielectric material may be composed of, for example, silicon dioxide or a high k dielectric material. The term "high-k dielectric material" is used in the present application to denote a dielectric material having a dielectric constant that is greater than the dielectric constant of silicon dioxide; the dielectric constant of silicon dioxide is typically about 3.9. The dielectric material that can be used to provide the high-k dielectric material may include, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

In some embodiments, the dielectric material may be a trench dielectric material such as, for example, silicon dioxide, that is embedded within a semiconductor substrate. In yet another embodiment, the dielectric material may be a gate dielectric of a semiconductor device and is formed via a deposition process on a surface of a semiconductor substrate.

Notwithstanding the type of material employed as the substrate 10, a first metal nitride layer 12 is formed on the substrate 10. The first metal nitride layer 12 includes a first metal nitride. In some embodiments of the present application, the first metal nitride includes, in addition to nitrogen, a transition metal selected from Groups 4, 5 and 6 of the Periodic Table of Elements. Exemplary first metal nitrides that may provide the first metal nitride layer 12 and contain a transition metal selected from Groups 4, 5 and 6 of the Periodic Table of Elements include, but are not limited to, titanium nitride, tungsten nitride, or tantalum nitride. In other embodiments of the present application, the first metal nitride may include, in addition to nitrogen, at least element from Group 13 of the Periodic Table of Elements. Exemplary first metal nitrides that may provide the first metal nitride layer 12 and contain at least one element selected from Group 13 of the Periodic Table of Elements include, but are not limited to, gallium nitride, indium nitride, or indium gallium nitride.

The first metal nitride layer 12 is a contiguous layer (i.e., without any breaks or voids) that is formed on the substrate 10 utilizing a deposition process such as, for example, chemical vapor deposition (CVD), plasma enhanced chemical vapor deposition (PECVD), physical vapor deposition (PVD) or sputtering. The first metal nitride layer 12 may have a thickness from 1 nm to 100 nm. Other thicknesses that are lesser than 1 nm, and greater than 100 nm may also be used as the thickness of the first metal nitride layer 12.

Figure 2:
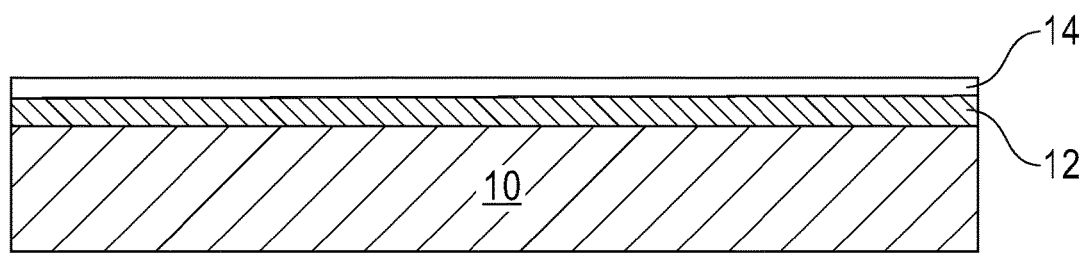
FIG. 2 is a cross sectional view of the exemplary semiconductor structure of FIG. 1 after incorporating oxygen into an upper portion of the first metal nitride layer to provide an oxygen rich metal nitride surface layer therein.

Referring now to FIG. 2, there is illustrated the exemplary semiconductor structure of FIG. 1 after incorporating oxygen into an upper portion of the first metal nitride layer 12 to provide an oxygen rich metal nitride surface layer 14 therein. The oxygen rich metal nitride surface layer 14 which is formed into an upper portion of the first metal nitride layer 12 may also be referred to herein as an oxidized metal nitride surface layer. By "oxygen rich metal nitride surface layer" it is meant, that the upper portion of the first metal nitride layer 12 has a higher oxygen content therein after oxygen incorporation as compared to the originally deposited first metal nitride layer 12.

In one embodiment, oxygen incorporation may include exposing the exemplary semiconductor structure shown in FIG. 1 to air. In some embodiments of the present application, air exposure may be performed at nominal room temperature (i.e., 15° C.–30° C.). In other embodiments, air exposure may be performed at temperature above nominal room temperature. In one example, air exposure may be performed at a temperature of greater than 40° C. up to, and including, 100° C. Air exposure may be performed for any period of time. In one example, the duration of air exposure may be from 30 minutes to 30 hours.

In another embodiment, oxygen incorporation may include a thermal oxidation process. The thermal oxidation process that is employed in the present application does not include an electrical bias higher than 200 W. In some embodiments, no electrical bias is performed during the thermal oxidation process. The thermal oxidation process employed in the present application is performed in any oxygen-containing ambient, which is not in the form of a plasma. The oxygen-containing ambients that can be employed in the present application include, but are not limited to, molecular oxygen ($O_2$), atomic oxygen (O), singlet oxygen (O*), ozone ($O_3$), water vapor, nitric oxide (NO), carbon monoxide (CO), carbon dioxide ($CO_2$), and nitrogen dioxide ($NO_2$). Mixtures of the aforementioned oxygen-containing ambients can also be employed in the present application. In some embodiments, the oxygen-containing ambient is used neat, i.e., non-diluted. In other embodiments, the oxygen-containing ambient can be diluted with an inert gas such as, for example, helium (He), neon (Ne), argon (Ar) and mixtures thereof.

Notwithstanding whether the oxygen-containing ambient is employed neat or diluted, the content of oxygen within the oxygen-containing ambient employed in the present application is typically from 10% to 100%, with a oxygen content within the oxygen-containing ambient from 50% to 80% being more typical. In one embodiment, the thermal oxidation process employed in the present application is performed at a temperature from 50° C. to 500° C. In another embodiment, the thermal oxidation process employed in the present application is performed at a temperature from 80° C. to 300° C. Thermal oxidation may be performed for any period of time. In one example, the duration of thermal oxidation may be from 5 minutes to 5 hours.

In some other embodiments of the present application, the oxygen incorporation can include a plasma oxidation process. When a plasma oxidation process is employed, an electrical bias of greater than 200 W can be employed. The plasma oxidation process is performed by generating a plasma from at least one of the oxygen-containing ambients that is mentioned above for the thermal oxidation process. In other embodiments, the oxygen-containing ambient that can be used during the plasma oxidation process can be diluted with an inert gas such as, for example, helium (He), neon (Ne), argon (Ar) and mixtures thereof. In one embodiment, the plasma oxidation process employed in the present application is performed at a temperature from 50° C. to 500° C. In another embodiment, the plasma oxidation process employed in the present application is performed at a temperature from 80° C. to 300° C. Plasma oxidation may be performed for any period of time. In one example, the duration of plasma oxidation may be from 5 minutes to 5 hours.

In yet another embodiment of the present application, the oxygen incorporation may include a radical oxidation process such as, for example, UV ozone.

In yet another embodiment of the present application, the oxygen incorporation may include a wet treatment process in which the exemplary semiconductor structure of FIG. 1 is contacted with a liquid oxygen-containing treatment solution such as, for example, water ($H_2O$), hydrogen peroxide ($H_2O_2$), or a ozone ($O_3$)-water ($H_2O$) mixture. The wet treatment may be performed at nominal room temperature or a temperature that is above room temperature (e.g., greater than 40° C. up to, and including, 100° C.). Wet treatment may be performed for any period of time. In one example, the duration of the wet treatment may be from 30 minutes to 30 hours.

The depth that the oxygen rich metal nitride surface layer 14 is formed into the first metal nitride layer 12 may vary. Typically, the oxygen rich metal nitride surface layer 14, as measured from the topmost exposed surface of the first metal nitride layer 12 inward, is from 0.5 nm to 20 nm, with a depth from 1 nm to 10 nm being more typical.

The oxygen rich metal nitride surface layer 14 is composed of the first metal nitride as mentioned above for the first metal nitride layer 12 with added oxygen. In some embodiments, the oxygen content of the oxygen rich metal nitride surface layer 14 is 0.1 atomic percent or greater. In one embodiment of the present application, the oxygen content of the oxygen rich metal nitride surface layer 14 can be from 0.1 atomic percent oxygen to 50 atomic percent oxygen. Oxygen contents of less than 0.1 atomic percent are also contemplated.

Figure 3:
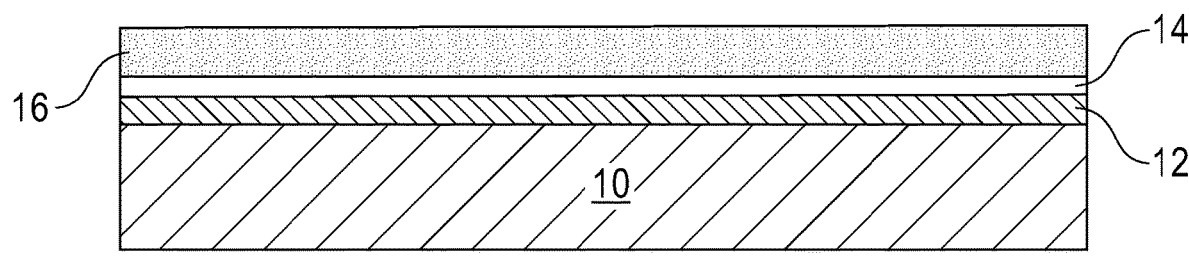
FIG. 3 is a cross sectional view of the exemplary semiconductor structure of FIG. 2 after forming a second metal nitride layer on the oxygen rich metal nitride surface layer of the first metal nitride layer.

Referring now to FIG. 3, there is illustrated the exemplary semiconductor structure of FIG. 2 after forming a second metal nitride layer 16 on the oxygen rich metal nitride surface layer 14 of the first metal nitride layer 12. In the present application, the oxygen rich metal nitride surface layer 14 provides an interface between the first metal nitride layer 12 and the second metal nitride layer 16.

The second metal nitride layer 16 includes a second metal nitride. In some embodiments of the present application, the second metal nitride includes, in addition to nitrogen, a transition metal selected from Groups 4, 5 and 6 of the Periodic Table of Elements. Exemplary second metal nitrides that may provide the second metal nitride layer 16 include, but are not limited to, titanium nitride, tungsten nitride, or tantalum nitride. In other embodiments of the present application, the second metal nitride may include, in addition to nitrogen, at least element from Group 13 of the Periodic Table of Elements. Exemplary second metal nitrides that may provide the second metal nitride layer 16 and contain at least one element selected from Group 13 of the Periodic Table of Elements include, but are not limited to, gallium nitride, indium nitride, or indium gallium nitride.

In some embodiments of the present application, the second metal nitride that provides the second metal nitride layer 16 is the same (in terms of composition) as the first metal nitride that provides the first metal nitride layer 12. In one example, each of the first and second metal nitrides is composed of titanium nitride. In other embodiments, the second metal nitride that provides the second metal nitride layer 16 is different (in terms of composition) than the first metal nitride that provides the first metal nitride layer 12. In one example, the first metal nitride is composed of titanium nitride, while the second metal nitride is composed of tantalum nitride.

The second metal nitride layer 16 is a contiguous layer (i.e., without any breaks or voids) that is formed on the oxygen rich metal nitride surface layer 14 utilizing a deposition process such as, for example, chemical vapor deposition (CVD), plasma enhanced chemical vapor deposition (PECVD), physical vapor deposition (PVD) or sputtering. The second metal nitride layer 16 may have a thickness from 1 nm to 100 nm. Other thicknesses that are lesser than 1 nm, and greater than 100 nm may also be used as the thickness of the second metal nitride layer 16.

In some embodiments of the present application (not shown), the second metal nitride layer 16 may be treated as described above to include an oxygen rich metal nitride surface layer, and at least one addition metal nitride layer may be formed above the oxygen rich metal nitride surface layer provided in the second metal nitride layer 16. In such an embodiment, a stack of metal nitride layers is provided in which each metal nitride layer of the stack of metal nitride layers is separated by an oxygen rich metal surface layer.

Figure 4:
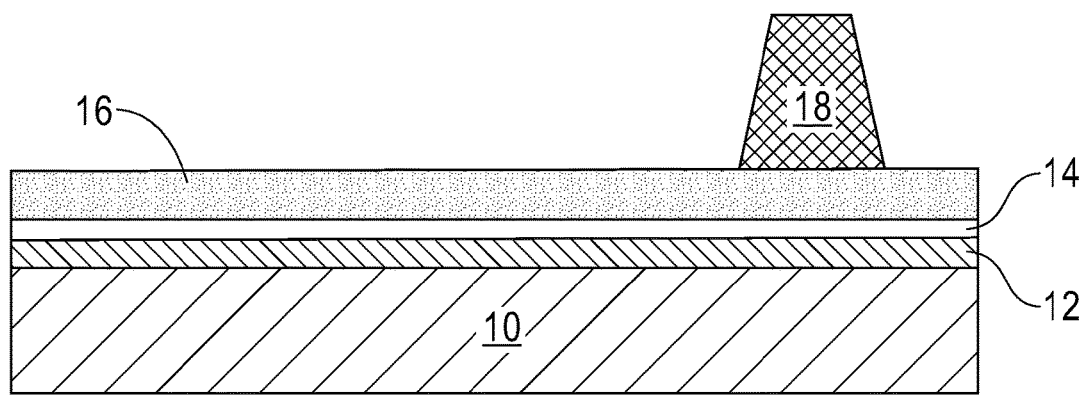
FIG. 4 is a cross sectional view of the exemplary semiconductor structure of FIG. 3 after forming a patterned mask on a surface of the second metal nitride layer.

Referring now to FIG. 4, there is illustrated the exemplary semiconductor structure of FIG. 3 after forming a patterned mask 18 on a surface of the second metal nitride layer 16. Although a single patterned mask 18 is described and illustrated, a plurality of patterned masks may be formed on the second metal nitride layer 16.

In one embodiment of the present application, the patterned mask 18 is composed of a photoresist material including for example, a positive-tone photoresist material, a negative-tone photoresist material or a hybrid-tone photoresist material. In such an embodiment, the patterned mask 18 can be formed by first providing a layer of a photoresist material on a surface of the second metal nitride layer 18 utilizing a deposition process such as, for example, spin-on coating or evaporation. The layer of photoresist material is then patterned by lithography. Lithography includes exposing the layer of photoresist material to a pattern of irradiation, and thereafter the exposed layer of photoresist material is developed utilizing a conventional resist developer.

In some embodiments of the present application, the patterned mask 18 may include an organic planarization layer (OPL). The OPL can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL can include a transparent organic polymer. The OPL can be a standard $C_xH_y$ polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. The OPL can be applied, for example, by spin-coating. In one embodiment, the thickness of the OPL can be from about 30 nm to about 200 nm, although lesser and greater thicknesses can also be employed.

The OPL can be patterned into patterned mask 18 by forming a layer of a photoresist material (as defined above) on OPL. After forming the layer of photoresist material, the layer of photoresist material is subjected to lithography (as defined above) to provide a patterned photoresist atop a portion of the OPL. The pattern provided by the patterned photoresist material can then be thereafter transferred into the OPL by utilizing at least one pattern transfer etching process. In one embodiment, the pattern transfer etch includes a dry etching process such as, for example, reactive ion etching. In another embodiment, a chemical etchant can be used. In still a further embodiment, a combination of dry etching and wet etching can be used transfer the pattern into the OPL. In some embodiments of the present application, the patterned photoresist material may be removed from atop the patterned OPL at this point of the present application utilizing a conventional resist stripping process such as, for example, ashing. In other embodiments, the patterned photoresist material and the patterned POL are used collectively as the patterned mask 18.

Figure 5:
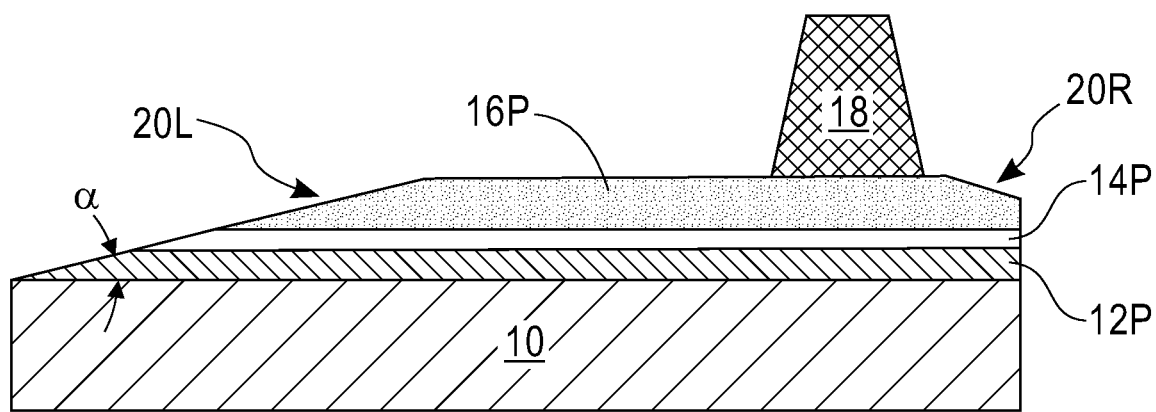
FIG. 5 is a cross sectional view of the exemplary semiconductor structure of FIG. 4 after performing an etch to provide a metal nitride structure having at least at least one tapered sidewall and comprising a remaining portion of the second metal nitride layer, a remaining portion of the oxygen rich metal nitride layer, and a remaining portion of the first metal nitride layer.

Referring now to FIG. 5, there is illustrated the exemplary semiconductor structure of FIG. 4 after performing a sputter etch to provide a metal nitride structure having at least at least one tapered sidewall 20L and comprising a remaining portion of the second metal nitride layer 16, a remaining portion of the oxygen rich metal nitride surface layer 14, and a remaining portion of the first metal nitride layer 14. In FIG. 5, element 20R denotes another sidewall of the metal nitride structure that may or may not be tapered depending upon the located on the patterned mask 18.

The remaining portion of the second metal nitride layer 16 may be referred to herein as a second metal nitride portion 16P, the remaining portion of the oxygen rich metal nitride surface layer 14 may be referred to herein as an oxygen rich metal nitride portion 14P, the remaining portion of the first metal nitride layer 12 may be referred to herein as a first metal nitride portion 12P. Collectively, the first metal nitride portion 12P, the oxygen rich metal nitride portion 14P and the second metal nitride portion 16P constitutes the metal nitride structure in accordance with an embodiment of the present application. In some embodiments and when a stack of metal nitride layers is provided in which each metal nitride layer is separated by an oxygen rich metal nitride surface layer, the tapered metal nitride structure includes a stack of metal nitride portions in which each metal nitride portion is separated by an oxygen rich metal nitride portion.

Tapered sidewall 20L includes exposed sidewalls of each of the first metal nitride portion 12P, the oxygen rich metal nitride portion 14P and the second metal nitride portion 16P. The at least one tapered sidewall 20L has a gentle slope. By "gentle slope" it is meant that the angle, a, between the tapered sidewall 20L and a planar bottommost surface of the first nitride portion 12P of the metal nitride structure (12P, 14P, 16P) is from 1 degree to 45 degrees. In another embodiment, the angle, a, is from 1 degree to 20 degrees, or from 1 degree to 10 degrees, or from 1 degree to 5 degrees.

The sputter etch (or ion sputtering) the can be employed in the present application bombards the surface of the exemplary semiconductor structure shown in FIG. 4 with ions. The sputter etch of the present application uses an inert gas (i.e., helium, argon, neon, xenon) or an inert gas mixture (e.g., helium/argon). The sputter etch can be performed using conditions that are well known to those skilled in the art. In one example, the sputter etch can be performed using the following conditions: a source power of about 500 W, a bias power of 100 W, a pressure of about 10 mTorr, an argon gas flow of 200 standard cubic centimeters (ccm). Other sputter etch conditions can be used besides the one exemplified in the present application.

As can be seen from the cross sectional view shown in FIG. 5, the first metal nitride portion 12P of the metal nitride structure (12P, 14P, 16P) has a first length, the oxygen rich metal nitride portion 14P of the metal nitride structure (12P, 14P, 16P) has a second length, and the second metal nitride portion 16P of the metal nitride structure (12P, 14P, 16P) has a third length, wherein the third length is less than the second length, and the second length is less than the first length.

Figure 6:
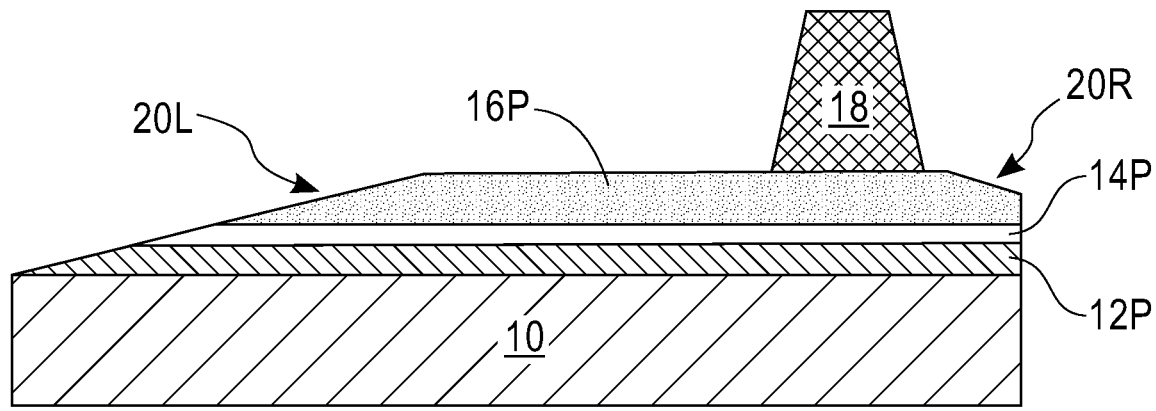
FIG. 6 is a cross sectional view of the exemplary semiconductor structure of FIG. 5 after performing a non-tapering touch-up etch.

Referring now to FIG. 6, there is illustrated the exemplary semiconductor structure of FIG. 5 after performing a non-tapering touch-up etch. In some embodiments, the non-tapering touch-up etch may be omitted. When performed, the non-tapering etch can removes, in a non-tapering manner, exposed portions of the first metal nitride portion 12P, the oxygen rich metal nitride portion 14P and the second metal nitride portion 16P of the metal nitride structure (12P, 14P, 16P), while still maintaining the tapered sidewall 20L.

In one embodiment of the present application, the non-tapering etch may include a dry etching process such as, for example, reactive ion etching. In another embodiment of the present application, the non-tapering etch may include a chemical wet etching process.

Figure 7:
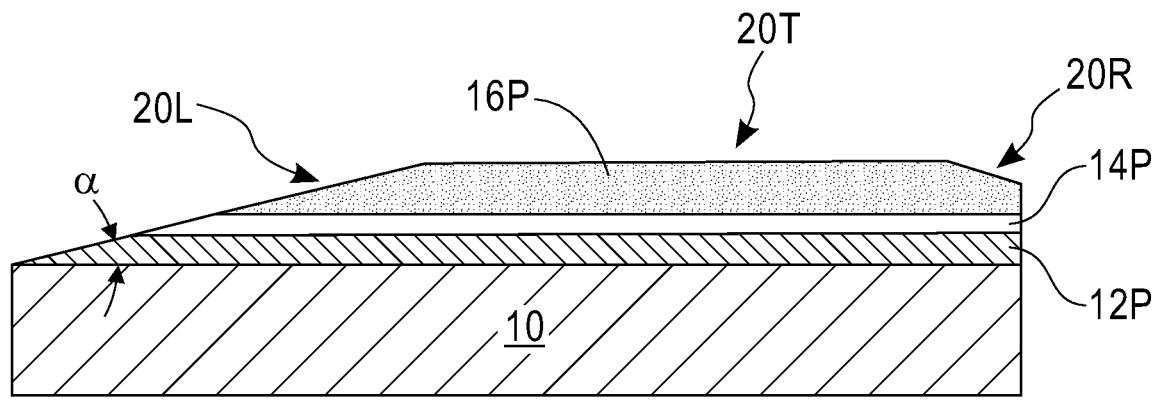
FIG. 7 is a cross sectional view of the exemplary semiconductor structure of FIG. 6 after removing the patterned mask.

Referring now to FIG. 7, there is illustrated the exemplary semiconductor structure of FIG. 6 after removing the patterned mask 18. The patterned mask 18 can be removed utilizing any conventional patterned mask removal process such as, for example, ashing, chemical etching, or planarization. In FIG. 7, element 20T denotes a topmost surface of the metal nitride structure (12P, 14P, 16P) which is planar and parallel with the bottommost surface of the metal nitride structure (12P, 14P, 16P).

Figure 8:
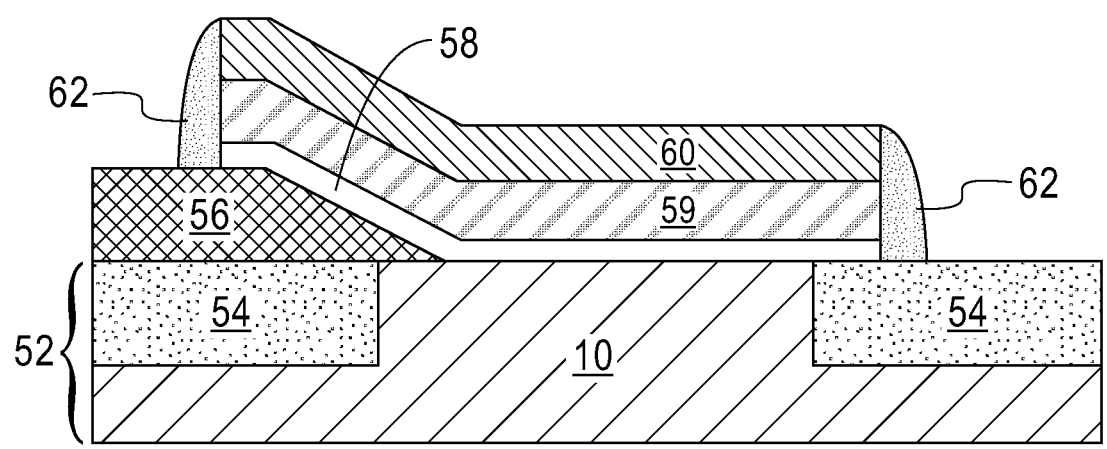
FIG. 8 is a cross sectional view of an exemplary semiconductor device that includes the tapered metal nitride structure of the present application as an electrode.

Referring now to FIG. 8, there is illustrated an exemplary semiconductor device 50 that includes the tapered metal nitride structure of the present application as an electrode. In this example, the metal nitride structure (12P, 14P, 16P) of the present application is labeled as element 56 and it is formed upon a semiconductor substrate 52 that has trench isolation regions 54 formed thereon. The trench isolation regions are formed of a trench dielectric material such as, for example, silicon dioxide.

The exemplary semiconductor device also includes a material stack of, from bottom to top, a quantum metal portion 58, a ferroelectric material portion 59, and an upper electrode 60. In some embodiments, a dielectric material as mentioned above in regard to substrate 10 may be used instead of, or in conjunction with, the quantum metal portion 58, for example, a dielectric material may formed beneath the quantum metal portion 58 or completely replace the quantum metal portion 58. In some embodiments, the ferroelectric material portion 59 may be replaced with a workfunction metal material. Dielectric spacers 62 such as, for example, silicon nitride, are formed on the exposed sidewalls of the material stack (58, 59, 60). The material stack (58, 59, 60) can be formed by depositing each of the various materials that constitute the stack and thereafter pattern the various deposited layers by lithography and etching. The dielectric spacers 62 can be formed by deposition of a dielectric spacer material and thereafter performing an anisotropic etch.

The quantum metal portion 58 may include doped strontium titanate. In some embodiments, the doped strontium titanate includes lanthanum as the dopant. The ferroelectric material portion 59 can include any ferroelectric perovskite material. Illustrative examples of ferroelectric perovskites that can be used include lead zirconate titanate ($PbZr_xTi_{1-x}O_3$ with $0 \leq x \leq 1$), barium strontium titanate ($Ba_{1-x}Sr_xTiO_3$ with $0 \leq x \leq 1$), barium titanate ($BaTiO_3$), bismuth iron oxide ($BiFeO_3$), and strontium bismuth tantalate ($SrBi_2Ta_2O_9$). In some embodiments, the ferroelectric material portion 59 can be composed of $HfO_2$ that is doped with Si, La, Zr and/or Y. The upper electrode 60 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), a perovskite or a multilayered combination thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprises:
   providing a first metal nitride layer on a surface of a substrate, wherein an oxygen rich metal nitride surface layer is located in an upper portion of the first metal nitride layer;
   forming a second metal nitride layer on the oxygen rich metal nitride surface layer of the first metal nitride layer;
   forming a patterned mask on the second metal nitride layer;
   performing a sputter etch utilizing an inert gas or inert gas mixture and the patterned mask as an etch mask, wherein the sputter etch removes a portion of each of the second metal nitride layer, the oxygen rich metal nitride surface layer, and the first metal nitride layer to provide a metal nitride structure having at least one tapered sidewall; and
   removing the patterned mask.

2. The method of claim 1, wherein the metal nitride structure has a planar bottommost surface and wherein an angle between the planar bottommost surface and the least one tapered sidewall is from 1 degree to 45 degrees.

3. The method of claim 1, further comprising:
   forming at least an upper electrode above the metal nitride structure.

4. The method of claim 1, wherein the first metal nitride layer is composed of a transition metal selected from Groups 4, 5 and 6 of the Periodic Table of Elements.

5. The method of claim 1, wherein the first metal nitride layer is composed of an element selected from Group 13 of the Periodic Table of Elements.

6. The method of claim 1, wherein the oxygen rich metal nitride surface layer has an oxygen content of 0.1 atomic percent of greater.

7. The method of claim 1, wherein the oxygen rich metal nitride surface layer has an oxygen content of from 0.1 atomic percent to 50 atomic percent.

8. The method of claim 1, wherein the second metal nitride layer is composed of a transition metal selected from Groups 4, 5 and 6 of the Periodic Table of Elements.

9. The method of claim 1, wherein the second metal nitride layer is composed of an element selected from Group 13 of the Periodic Table of Elements.

10. The method of claim 1, wherein the first metal nitride layer has a same composition as the second metal nitride layer.

11. The method of claim 1, further comprising performing a non-tapering touch up etch after the sputter etch and prior to the removing the patterned mask.

12. The method of claim 11, wherein the non-tapering touch up etch comprises dry etching or wet etching.

13. The method of claim 1, wherein the first metal nitride layer is compositionally different from the second metal nitride layer.

14. The method of claim 13, wherein the first metal nitride layer is composed of titanium nitride, and the second metal nitride layer is composed of tantalum nitride.

15. The method of claim 1, further comprising forming an oxygen rich material nitride surface layer in the second metal nitride layer prior to the forming of the patterned mask.

16. The method of claim 15, wherein the forming the oxygen rich material nitride surface layer in the second metal nitride layer comprises:
   incorporating oxygen into the upper portion of the second metal nitride layer, wherein the incorporating of the oxygen comprises air exposure, thermal oxidation, plasma oxidation, radical oxidation or a wet treatment process.

17. The method of claim 1, wherein the providing the first metal nitride layer on the surface of the substrate comprises:
   depositing the first metal nitride layer; and
   incorporating oxygen into the upper portion of the first metal nitride layer to provide the oxygen rich metal nitride surface layer.

18. The method of claim 17, wherein the incorporating oxygen is performed by air exposure.

19. The method of claim 17, wherein the incorporating oxygen comprises thermal oxidation, plasma oxidation or radical oxidation.

20. The method of claim 17, wherein the incorporating oxygen comprises a wet treatment process.

* * * * *